United States Patent [19]

O'Neill

[11] Patent Number: 4,827,156
[45] Date of Patent: May 2, 1989

[54] NON-OVERLAPPING SWITCH DRIVE IN PUSH-PULL TRANSISTOR CIRCUIT

[75] Inventor: Dennis P. O'Neill, Mountain View, Calif.

[73] Assignee: Linear Technology Inc., Milpitas, Calif.

[21] Appl. No.: 127,865

[22] Filed: Dec. 1, 1987

[51] Int. Cl.⁴ .................... H03K 17/08; H03K 17/26; H03K 17/28

[52] U.S. Cl. .................................. 307/255; 307/262; 307/300

[58] Field of Search ................. 307/255, 262, 300

[56] References Cited

U.S. PATENT DOCUMENTS 3,831,102  8/1974  Medal ................................... 307/300
4,095,128  6/1978  Tanigaki ............................... 307/300
4,272,691  6/1981  Hendriks .............................. 307/300
4,593,210  6/1986  Boyer .................................. 307/300

Primary Examiner—John Zazworsky
Attorney, Agent, or Firm—Flehr, Hohbach, Test, Albritton & Herbert

[57] ABSTRACT

A push-pull circuit in which an output terminal is alternately connected to first and second voltage potentials through first and second bipolar transistors, first biasing circuitry is provided for controlling the conductance of the first transistor with the first biasing circuitry being responsive to the base/emitter voltage of the second transistor whereby the first transistor cannot be biased on while the second transistor is conductive, and biasing circuitry is provided for the second transistor with the second bias circuitry being responsive to base/emitter voltage of the first transistor whereby the second transistor cannot be biased on while the first transistor is conductive.

4 Claims, 1 Drawing Sheet

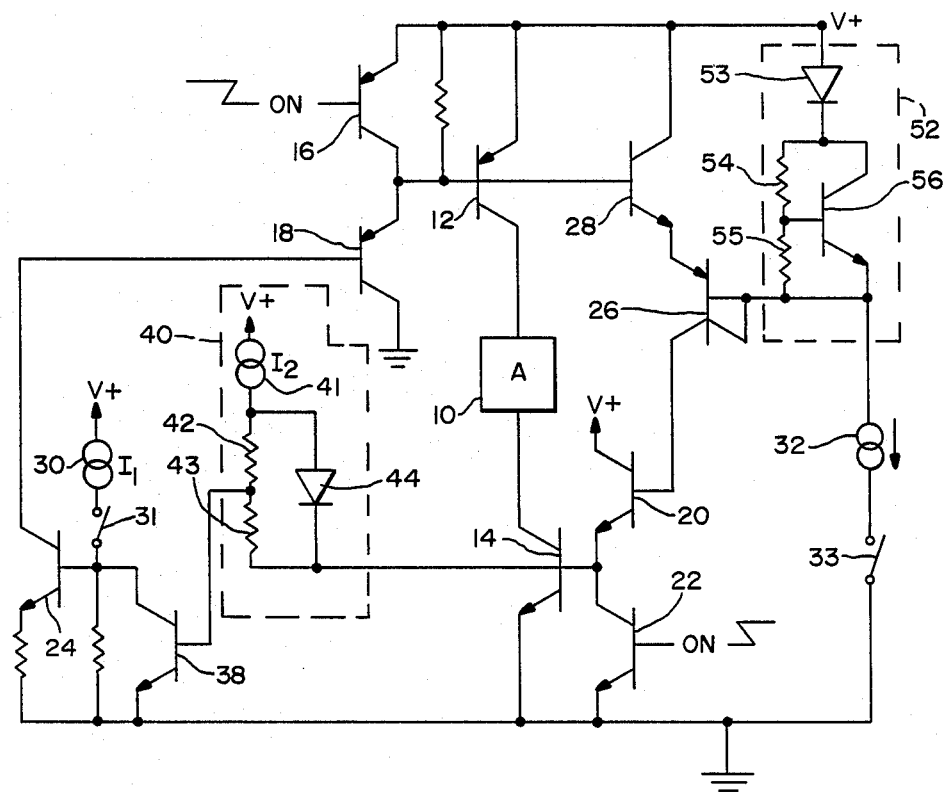

NON-OVERLAPPING SWITCH DRIVE IN PUSH-PULL TRANSISTOR CIRCUIT

BACKGROUND OF THE INVENTION

This invention relates generally to transistor switching circuitry, and more particularly the invention relates to push-pull transistor circuitry.

In a push-pull circuit, an output terminal is alternately switched between positive and negative (or ground) voltage potentials. Such circuits can be used in a voltage converter such as the Linear Technology LT1054. In the LT1054 device the transistors are designed to handle 300-400 milliamperes (mA) of current. Since they are connected serially between positive and ground potentials, if the two transistors in the LT1054 are allowed to conduct simultaneously, large supply currents will flow, wasting power and possibly damaging the circuit.

The transistors are driven into saturation when they are conducting, and this results in excess charge in the base region of the conducting transistor. The base charge slows the turn-off time for the transistor, since the excess charge must be removed or allowed to recombine before the transistor turns off. In turning off a saturated transistor, there is an initial drop of about 10% in the base/emitter voltage. After the initial drop, the base/emitter voltage stays high until all the excess charge is either removed or recombines with majority carriers. During this period, the transistor is still saturated or conducting large currents. Once the excess charge is removed, the base/emitter voltage collapses and the transistor is turned off. Thus, as long as the transistor base/emitter voltage is significant, the transistor is considered turned on, and the fact that the base/emitter voltage collapses is an indication of transistor turn-off.

SUMMARY OF THE INVENTION

An object of the invention is an improved push-pull transistor circuit.

Another object of the invention is a push-pull circuit having non-overlapping switch drive.

Yet another object of the invention is a push-pull circuit having non-overlapping switch drive with minimum switch delays, thereby improving switching speed.

Another object of the invention is a push-pull circuit in which all switch threshold levels are a function of the base/emitter voltage and therefore track with temperature changes.

A feature of the invention is circuitry responsive to the base/emitter voltage of a saturated transistor for preventing the turn-on of another transistor until the initially saturated transistor has turned off as evidenced by the collapse of its base/emitter voltage.

Briefly, in accordance with one embodiment of the invention, two transistors alternately connect an output terminal to a positive voltage potential and a negative voltage potential (or ground). A first current source is provided for turning on the first transistor, and a second current source is provided for turning on the second transistor. The first current source includes circuitry responsive to the base/emitter voltage of the second transistor for preventing the turn-on of the first transistor until the base/emitter voltage of the second transistor collapses. Similarly, the second current source includes circuitry responsive to the base/emitter voltage of the first transistor for preventing the turn-on of the second transistor until the base/emitter voltage of the first transistor collapses. Accordingly, the conduction of one transistor is prevented until the other transistor turns off as evidenced by collapse of base/emitter voltage of the other transistor.

The invention and objects and features thereof will be more readily apparent from the following detailed description and appended claims when taken with the drawing.

DESCRIPTION OF THE DRAWING

The drawing is a schematic diagram of a push-pull transistor circuit including non-overlapping switch drive in accordance with one embodiment of the invention.

DETAILED DESCRIPTION OF ILLUSTRATIVE EMBODIMENT

Referring now to the drawing, one embodiment of a push-pull type circuit using the non-overlapping switch drive in accordance with the invention is illustrated.

In this embodiment, a terminal 10 is connected to a positive potential, V+, through PNP transistor 12, and to a ground potential through NPN transistor 14. Transistors 12 and 14 are turned on and off sequentially to alternately connect the terminal 10 to the positive or V+ potential and to the ground potential.

PNP transistors 16 and 18 are serially connected between V+ and ground potentials with the common terminal connected to the base of transistor 12, and NPN transistors 20 and 22 are serially connected between V+ and ground potentials with the common terminal of the transistors connected to the base of transistor 14. When transistor 16 is conducting, a positive potential is applied to the base of transistor 12 rendering the transistor non-conducting. Similarly, when transistor 22 is conductive, a ground potential is applied to the base of transistor 14 rendering transistor 14 non-conducting.

The conductance of transistor 18 applies a forward bias current to the base of transistor 12, thereby causing transistor 12 to conduct. Similarly, the conductance of transistor 20 applies a forward bias current to the base of transistor 14, thereby rendering transistor 14 conductive. Transistor 18 becomes conductive in response to the conductance of transistor 24, and transistor 20 becomes conductive upon the conductance of transistor 26. Current sources 30 and 32 are alternately connected through switches 31 and 33 to control the conduction of transistors 24 and 26.

As above described, when either transistor 12 or transistor 14 is driven into saturation, excess charge is stored in the base region of the conducting transistor. In order to turn the transistor off, the excess charge must be removed or allowed to recombine. In accordance with the present invention, circuitry is provided that responds to the base/emitter voltage created by the excess charge in the base region to prevent conductance of the other transistor until the excess charge of the previously-on transistor is removed.

Assume that transistor 14 is driven on (current is applied to the base of transistor 14 via transistor 20) and that transistor 12 is off (the base of transistor 12 is pulled up to V+ by transistor 16).

At the switch transition, the current source 32 is turned off by opening switch 33 and current source 30 is turned on by closing switch 31. Transistor 22 is turned on, and transistor 16 turns off. However, until the base/emitter voltage of transistor 14 collapses to approximately one-half of its nominal value, transistor 38 remains conducting via a biasing network 40, thereby maintaining a ground potential on the base of transistor 24 and holding transistor 24 nonconductive. Network 40 consists of current source 41 serially connected with voltage divider resistors 42 and 43 and with diode 44 shunting resistors 42, 43. Once the base/emitter voltage of transistor 14 collapses, a ground potential is applied at the common node of resistor 43 and diode 44. The voltage divider then applies a voltage of one-half $V_{BE}$ above ground to the base of transistor 38 which is insufficient to maintain transistor 38 conductive. Transistor 24 becomes conductive upon the non-conductance of transistor 38, whereupon transistor 18 becomes conductive thereby rendering transistor 12 conductive.

For the opposite transition, assume that transistor 12 is driven on by transistor 18 and transistor 14 is off (its base is pulled to ground by transistor 22). At the clock transition edge, current source 30 is turned off and current source 32 is turned on. Transistor 16 is turned on, and transistor 22 is turned off. However, until the base/emitter voltage of transistor 12 collapses to approximately one-half of its nominal value, bias network 52 prevents transistors 26 and 28 from turning on and supplying drive current to transistor 20 which in turn controls the conductance of transistor 14. Bias network 52 consists of diode 53 serially connected with resistors 54, 55 which function as a voltage divider for biasing the base of NPN transistor 56 such that the voltage across transistor 56 is equal to 1.5 $V_{BE}$. Network 52 maintains a voltage the base of transistor 26 equal to 2.5 $V_{BE}$. This prevents the turn-on of transistors 26 and 28 until the base/emitter voltage of transistor 12 collapses to one-half of its nominal value ($\sim$0.5 $V_{BE}$). Accordingly, the base/emitter voltage of the saturated transistor 12 is utilized to prevent conductance of the other transistor until the first transistor turn off and its base/emitter voltage collapses.

Accordingly, the base/emitter voltage of a saturated transistor is utilized to prevent conductance of the other transistor until the first transistor becomes nonconductive and the base/emitter voltage thereof collapses. NPN transistor 38 has its base connected through biasing circuitry 40 to the base of transistor 14 and prevents the conductance of transistor 24 until the base/emitter voltage of transistor 14 collapses. Similarly, transistor 28 is serially connected with transistor 26 to apply a positive potential to the emitter of transistor 26, and transistors 26 and 28 remain nonconductive so long as transistor 12 is conductive, thereby preventing the application of forward-bias current to the base of transistor 20. Bias circuitry 52 is connected between V+ and the base of transistor 26 to maintain transistors 26 and 28 nonconductive when switch 33 is open.

Since the switching threshold levels are functions of base/emitter voltage, the thresholds track temperature changes at $V_{BE}$. Further, switching speed of the circuit is improved since one of the push-pull transistors becomes conductive immediately upon the non-conductance of the other transistor as determined by the collapse of $V_{BE}$ of the other transistor. This prevents overlap with a minimum amount of delay.

While the invention has been described with reference to a specific embodiment, the description is illustrative of the invention and not to be construed as limiting the invention. Various modifications and applications may occur to those skilled in the art without departing from the true spirit and scope of the invention as defined by the appended claims.

I claim:

1. A circuit for sequentially applying first and second voltage potentials to an output terminal, said first voltage potential being more positive than said second voltage potential, said circuit comprising
    a first bipolar transistor having emitter, base and collector terminals and connecting said output terminal to said first voltage potential,
    a second bipolar transistor having emitter, base and collector terminals and connecting said output terminal to said second voltage potential,
    first control circuitry for controlling the conductance of said first transistor, said first control circuitry being interconnected with the base terminal of said second transistor and responsive to base/emitter voltage of said second transistor to prevent conductance of said first transistor until said second transistor is off, and
    second control circuitry for controlling the conductance of said second transistor, said second control circuitry being interconnected with the base terminal of said first transistor and responsive to the base/emitter voltage of said first transistor to prevent conductance of said second transistor until said first transistor is off.

2. The circuit as defined by claim 1 wherein said first control circuitry includes third and fourth bipolar transistors serially connected between said first and second voltage potentials with the common terminal thereof connected to the base of said first transistor, the conductance of said third transistor rendering said first transistor nonconductive, and the conductance of said fourth transistor rendering said first transistor conductive;
    said second control circuit including fifth and sixth bipolar transistors serially connected between said first and second voltage potentials with the common terminal thereof connected to the base of said second transistor, the conductance of said fifth transistor rendering said second transistor nonconductive, and the conductance of said sixth transistor rendering said second transistor conductive.

3. The circuit as defined by claim 2 wherein said first control circuitry further includes first biasing circuitry for applying a control voltage to the base of said fourth transistor, said first biasing circuitry being responsive to the base/emitter voltage of said second transistor,
    said second control circuitry includes second biasing circuitry for said sixth transistor, said second biasing circuit being responsive to the base/emitter voltage of said first transistor in applying a bias voltage to said sixth transistor.

4. In a push-pull circuit in which a terminal is alternately connected to said first and second voltage potentials through first and second bipolar transistors, a method of providing non-overlapping drive to said first and second transistors comprising the steps of
    providing first biasing circuitry for said first transistor with said first biasing circuitry being responsive to the base/emitter voltage of said second transistor, whereby bias voltage cannot be applied to said first transistor when said second transistor is conducting, and
    providing second biasing circuitry for said second transistor with said second biasing circuitry being responsive to base/emitter voltage of said first transistor whereby said second transistor cannot be turned on while said first transistor is conductive.

* * * * *